(12) United States Patent
Kitahara et al.

(10) Patent No.: US 6,344,155 B1
(45) Date of Patent: Feb. 5, 2002

(54) ELECTRICALLY CONDUCTIVE ADHESIVE COMPOSITION, ELECTRICALLY CONDUCTIVE ADHESIVE SHEET AND USE THEREOF

(75) Inventors: Hiroshi Kitahara; Kensaku Higashi, both of Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/541,716

(22) Filed: Apr. 3, 2000

(30) Foreign Application Priority Data

Apr. 6, 1999 (JP) .......................................... 11-098500
Jan. 28, 2000 (JP) .......................................... 12-019583

(51) Int. Cl.⁷ ............................................... H01B 1/04
(52) U.S. Cl. .......................... 252/502; 252/512; 442/6; 442/117
(58) Field of Search ............................... 252/512, 502; 442/117, 6

(56) References Cited

U.S. PATENT DOCUMENTS

| | | | | | |
|---|---|---|---|---|---|
| 3,989,531 A | * | 11/1976 | Orlando et al. | ............. | 524/288 |
| 4,742,104 A | * | 5/1988 | Lindner et al. | ............... | 525/74 |
| 5,399,295 A | * | 3/1995 | Gamble et al. | ............... | 252/511 |
| 5,530,044 A | * | 6/1996 | Mack et al. | ................. | 524/366 |
| 5,736,070 A | * | 4/1998 | Murakami et al. | .......... | 252/512 |

* cited by examiner

*Primary Examiner*—Cathy Lam
(74) *Attorney, Agent, or Firm*—Wenderoth, Lind & Ponack, LLP

(57) ABSTRACT

An electrically conductive adhesive composition which has flexibility and folding endurance and is feasible for use as a shield against electromagnetic waves from a flexible printed circuit, comprises 100 parts by weight of (a) an acrylonitrile-butadiene copolymer, 20 to 500 parts by weight of (b) a phenolic resin and/or an epoxy resin, 1 to 100 parts by weight, per 100 parts by weight of the components (a) and (b) in total, of (c) an electrically conductive filler and 1 to 50 parts by weight, per 100 parts by weight of the components (a) and (b) in total, of (d) a bromine-containing flame retardant.

18 Claims, No Drawings

ELECTRICALLY CONDUCTIVE ADHESIVE COMPOSITION, ELECTRICALLY CONDUCTIVE ADHESIVE SHEET AND USE THEREOF

FIELD OF THE INVENTION

The present invention relates to an electrically conductive adhesive composition and an electrically conductive adhesive sheet having flexibility and folding endurance feasible for use as a shield against electromagnetic waves in a flexible printed circuit (FPC), an electromagnetic wave shield material formed by integrating these with an electrically conductive fiber sheet, and an electromagnetic-wave-shield-functioning flexible printed wiring board formed by laminating the electromagnetic wave shield material on a flexible substrate.

DESCRIPTION OF THE PRIOR ART

With regard to an electromagnetic wave shield of a cable for connecting electronic machines or devices, conventionally, a group of shield cables obtained by braiding individual conductive cables is used. Since, however, a group of bundled shield cables in a larger number is used, it is difficult to attain a decrease in size and thickness.

Electronic machines, devices and peripheral hardware are recently decreasing in size and thickness, and it is accordingly required to decrease the size and thickness of the cables per se. Hand-held computers in particular appreciably tend to be downsized and decreased in thickness together with versatile functions and higher performances. The system of interface cables for connecting a computer and a display is changing from a system of a group of bundled cables to a system of flat cables and further to a system of a flexible printed wiring board (FPC) having a small thickness. Moreover, for faster transmission of information, frequency in a higher frequency band comes to be used, and FPC comes to be required to have higher electromagnetic wave shield property than it has so far had. Specifically, useless electromagnetic waves from inside FPC are generated from a pattern used for a basic clock, and electromagnetic waves having a frequency of 150 to 700 MHz are mainly included at present. As measures for electromagnetic wave shield of FPC, a solid grounding plate is formed by bonding a copper foil to one surface or each surface of FPC. However, there are caused problems that the electromagnetic wave shield function is poor since the copper foil is generally attached with an adhesive having the level of an insulator having a volume resistivity of $10^7$ Ωcm or more as an electric resistance, and that the copper foil is not sufficiently durable in a bending test and undergoes brittle fracture.

FPC is increasingly used as electronic machines and devices are decreased in size and thickness as described above, and FPC accordingly comes to be required to have high electromagnetic wave shield properties in addition to flexibility, a lighter weight, a smaller thickness and electric properties. The present inventors have therefore proposed a metal fiber sheet for shielding against electromagnetic wave, as a method of attaining effective The above electromagnetic wave shield method is excellent, while it is not yet fully satisfactory as far as flame retardancy is concerned. That is, UL-94 which is the combustion test standard of plastic materials for parts is applied to electronic machines and devices for which the above electromagnetic wave shield material is used, and the electromagnetic wave shield material is required to have flame retardancy grades of a V-1 or V-0 level. There is therefore demanded an electromagnetic wave shield method which accomplishes excellent flame retardancy of the above standard levels.

SUMMARY OF THE INVENTION

It is an object of the present invention to provide an electrically conductive adhesive composition and an electrically conductive adhesive sheet, having excellent flame retardancy without impairing excellent electric conductivity.

It is another object of the present invention to provide an electromagnetic wave shield material formed by integrating an electrically conductive adhesive composition or an electrically conductive adhesive sheet with an electrically conductive fiber sheet or metal foil, which electromagnetic wave shield material has flexibility and folding endurance feasible particularly for use as an electromagnetic wave shield of a flexible printed wiring board (FPC).

It is further another object of the present invention to provide an electromagnetic-wave-shield-functioning flexible printed wiring board having the property of electromagnetic wave shield, formed by applying the above electromagnetic wave shield material to a flexible printed wiring board.

According to the present invention, there is provided an electrically conductive adhesive composition comprising 100 parts by weight of (a) an acrylonitrile-butadiene copolymer, 20 to 500 parts by weight of (b) a phenolic resin and/or an epoxy resin, 1 to 100 parts by weight, per 100 parts by weight of the components (a) and (b) in total, of (c) an electrically conductive filler and 1 to 50 parts by weight, per 100 parts by weight of the components (a) and (b) in total, of (d) a bromine-containing flame retardant.

According to the present invention, there is also provided an electrically conductive adhesive composition according to the above, wherein the bromine-containing flame retardant contains at least 50% by weight of brome and has a melting point of at least 100° C.

According to the present invention, there is also provided an electrically conductive adhesive composition according to the above, wherein the bromine-containing flame retardant is a tetrabromobisphenol A derivative of the following formulas.

acrylonitrile-butadiene copolymer (a) has a relatively high nitrile content of 10 to 45%, preferably 20 to 45% and a molecular weight of 3,000 to 1,000,000, preferably 3,000 to 10,000, or 50,000 to 500,000. Such an acrylonitrile-butadiene copolymer is preferred in the present invention.

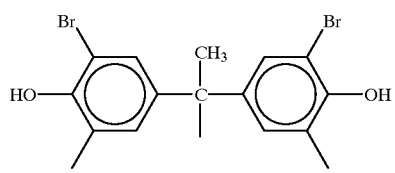

or

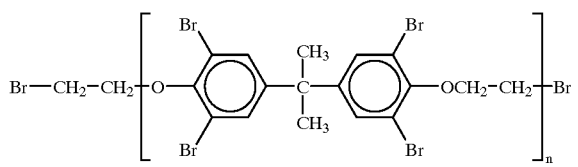

According to the present invention, there is also provided an electrically conductive adhesive composition according to the above, which further contains 1 to 10 parts by weight, per 100 parts by weight of the components (a) and (b) in total, of (e) a stabilizer.

According to the present invention, there is also provided an electrically conductive adhesive sheet formed of the above electrically conductive adhesive composition in the form of a sheet.

According to the present invention, there is also provided an electromagnetic shield material formed of the above electrically conductive adhesive composition and an electrically conductive fiber sheet having a surface resistivity of 1 $\Omega/\square$ or less, wherein the electrically conductive fiber sheet is impregnated with the electrically conductive adhesive composition or the electrically conductive adhesive composition is applied to the electrically conductive fiber sheet.

According to the present invention, there is also provided an electromagnetic shield material formed of a laminate of the above electrically conductive adhesive sheet and an electrically conductive fiber sheet or metal foil having a surface resistivity of 1 $\Omega/\square$ or less, wherein the electrically conductive adhesive sheet is laminated on one surface, or each surface, of the electrically conductive fiber sheet or metal foil and the electromagnetic shield material is shaped under pressure.

According to the present invention, there is also provided an electromagnetic-wave-shield-functioning flexible printed wiring board formed of the above electromagnetic wave shield material and a flexible printed wiring board, wherein the electromagnetic wave shield material is laminated on one surface, or each surface, of the flexible printed wiring board.

DETAILED DESCRIPTION OF THE INVENTION

The components for constituting the electrically conductive adhesive composition of the present invention will be explained first. The acrylonitrile-butadiene copolymer (a) is an essential component for imparting the electrically conductive adhesive composition with flexibility and also works to improve the adhesion of the composition to a substrate. The acrylonitrile-butadiene copolymer is selected from many elastomer materials by taking into account cold resistance, oil resistance, aging resistance, abrasion resistance, folding endurance and a cost. Specifically, the acrylonitrile-butadiene copolymer (a) has a relatively high nitrile content of of 10 to 45 a, preferably 20 to 45% and a molecular weight of 3,000 to 1,000,000, preferably 3,000 to 10,000, or 50,000 to 500,000. Such an acrylonitrile-butadiene copolymer is preferred in the present invention.

The phenolic resin and/or the epoxy resin (b) are/is thermosetting resin(s) having the function of adhesion to a substrate. The phenolic resin is preferably a resol type phenolic resin. Further, as resol type phenolic resin, one or at least two resins selected from bisphenol A and an alkylphenol are preferred, or a co-condensation phenolic resin of these is preferred. The resol type phenolic resin of bisphenol A type is a product produced by synthesis using bisphenol A as a starting material, and a product having a softening point, measured by a ring and ball test, of 70 to 90° C. is preferred. The resol type phenolic resin of alkylphenol type is a product produced by synthesis using, as a starting material, a compound having alkyl group(s) mainly in the p- and/or o-position(s) relative to a phenolic hdyroxyl group. The alkyl group includes methyl, ethyl, propyl, tert-butyl, nonyl, etc. For example, as a resol type phenolic resin of p-tert-butylphenol type, a product having a softening point, measured by a ring and ball test, of 80 to 100° C. is preferred. The above resol type phenolic resin may contain phenol components such as p-phenylphenol and halogenated phenol other than the above phenol component. Further, a small amount of a novolak type phenolic resin may be contained together with the resol type phenolic resin.

The epoxy resin can be selected from various types such as bisphenol A type, novolak type, bisphenol F type, alicyclic and glycidyl ester type epoxy resins. In the present invention, when an epoxy resin and a phenolic resin are used in combination, these two compounds react under heat to give a cured product having higher heat resistance. When the phenolic resin is not used in combination, a curing agent is added to the epoxy resin. In the present invention, the curing agent is preferably selected from imidazole curing agents such as 2-methylimidazole, 2-ethyl-4-methylimidazole, 2-phenylimidazole, 1-benzyl-2-methylimidazole, 2-lheptadecylimidazole, 1-cyanoethyl-2-methylimidazole, 1-cyanoethyl-2-ethyl-4-methylimidazole, 2,4-diamino-6-[2-methylimidazolyl-(1)]-ethyl-S-triazinie, 2,4-diamino-6-[2-ethyl-4-methylimidazolyl-(1)]-ethyl-S-triazine, etc.

The electrically conductive filler can be selected from metal-containing powders including powders of metals such as Al, Au, Pt, Pd, Cu, Fe, Ni, solder, stainless steel, ITO and ferrite, alloys of these and metal oxides, and a carbon powder (including graphite). In view of a cost, a carbon powder is particularly preferred. The carbon powder can be preferably selected from acetylene black or graphite carbon, which has excellent electric conductivity. The carbon powder preferably has a DBP oil absorption of 20 to 200 ml/100 g, more preferably 80 to 200 ml/g, when measured according to JIS-K6221. When the oil absorption is less than the above lower limit, the particle size of the powder is too large, so that it is difficult to impart the adhesive composition of the present invention with a desired electric conductivity. When it exceeds the above upper limit, the electric conductivity is low due to poor dispersion of the carbon. The primary particle diameter of the carbon is preferably 15 to 60 nm, more preferably 25 to 50 nm. When the primary particle diameter of the carbon is smaller than 15 nm, the carbon is liable to be dispersed poorly. When it exceeds 60 nm, it is difficult to obtain a desired electric conductivity. For increasing the electric conductivity, the above carbon powder and the above metal-containing powder may be used in combination. Further, the adhesive composition of the present invention may also contain electrically conductive fibers such as a metal fiber, a carbon fiber and a metal-plated fiber.

The bromine-containing flame retardant (d) is used for imparting the electrically conductive adhesive composition, the electrically conductive adhesive sheet and the electromagnetic wave shield material of the present invention with flame retardancy. The bromine-containing flame retardant (d) has the highest flame-retarding effect among various flame retardants. Specifically, the bromine-containing flame retardant (d) includes hexabromobenzene, hexabromocyclododecane, tribromophenol, hexabromobiplhenyl ether, octabromobiphenyl ether, decabromobiphenyl ether, dibromocresyl grycidyl ether, tetrabromobisphenol A, tetrabromophtalic anhydride, poly(pentabromobenzyl) acrylate and a brominated epoxy resin, etc., although the bromine-containing flame retardant (d) shall not be limited thereto. Further, the bromine-containing flame retardant (d) can be selected from compounds having a molecule containing both bromine and phosphorus, such as bis(2,3-dibromopropyl)2,3-dibromopropyl phosphate, tris(2,3-dibromophenyl) phosphate and tris(tribromoneopentyl) phosphate, etc. The above flame retardants may be used alone or in combination.

In the present invention, of the above bromine-containing flame retardants, a bromine-containing flame retardant having a bromine content of at least 50% by weight is preferred, and a bromine-containing flame retardant having a bromine content of at least 55% by weight is particularly preferred. A bromine-containing flame retardant having a melting point of at least 100° C. is preferred, a bromine-containing flame retardant having a melting point of at least 150° C. is more preferred. When the above bromine content is less than 50% by weight, it is difficult to attain the flame retardancy of V-0 in the above UL standard so long as the bromine-containing flame retardant is contained in the amount range specified in the present invention. Further, when the above melting point is lower than 100° C., there may be caused a problem that the initial adhesion strength of an electromagnetic-wave-shield-functioning flexible printed wiring board obtained by laminating the electromagnetic wave shield material on FPC is low, or that the flexible printed wiring board shows a decrease in adhesion when left at a high temperature or in a high-temperature and high-humidity environment.

Of the bromine-containing flame retardants, the tetrabromobisphenol A derivative includes a tetrabromobisphenol A monomer of the following formula, an oligomer of said monomer, a carbonate oligomer of tetrabromobisphenol A and a derivative of the following structural formula. These flame retardants have the highest flame-retarding effect among various flame retardants, and they do not impair flexibility, durability of adhesion strength against high temperatures and durability of adhesion strength against high temperatures and high humidity. The above derivatives are commercially available in the trade names of "Fire Guard 2000", "Fire Guard 3000", "Fire Guard 3010", "Fire Guard 3100" and "Fire Guard 7500", supplied by Teijin Kasei K.K. Of these, "Fire Guard 3000" and "Fire Guard 3010" are preferred. When the tetrabromobisphenol A derivative is used, the level of VTM-0 in the UL94 vertical combustion test can be easily attained.

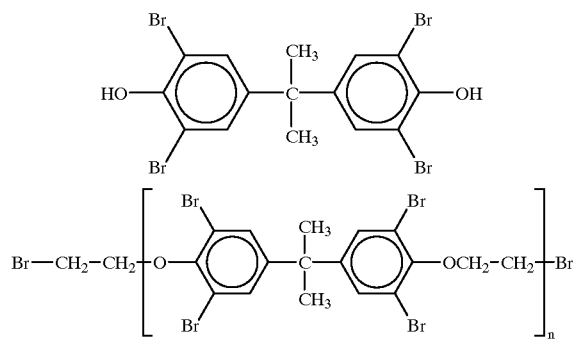

The electromagnetic wave shield material formed a laminate of the electrically conductive adhesive sheet and an electrically conductive fiber sheet is morphologically likely to burn, and it does not easily arrive at the level of VTM-0 in the UL94 vertical combustion test, so that it is required to select the flame retardant from a limited range. For this reason, the above tetrabromobisphenol A derivative is particularly preferred.

The tetrabromobisphenol A derivative not only imparts excellent flame retardancy and flexibility, but also produces a remarkable effect that the adhesion strength does not much decrease at a high temperature or in a high-temperature and high humidity environment. Further, since it has a high molecular weight, it is not deposited on an adhesive surface. Moreover, since it has a high melting point and a high decomposition point, it can add excellent properties to the heat resistance of the electromagnetic wave shield material of the present invention.

In the present invention, it is preferred to use a stabilizer (e) in addition to the above components (a) to (d).

The stabilizer (e) is incorporated for preventing the oxidative deterioration, heat deterioration and aging which the above components (a) and (b) have due to oxygen and ozone in air. Specifically, the stabilizer (e) can be selected from phenol-containing antioxidants such as 2,6-di-tert-butyl-p-cresol, 2,6-di-tert-butyl-4-ethylphenol, stearyl-β-(3,5-di-tert-butyl-4-hydroxyphenyl) propionate, 2,2-methylene-bis-(4-methyl-6-tert-butylphenol), 4,4'-thiobis-(3-methyl-6-tert-butylphenol), 4,4'-butylidene-bis-(3-methyl-6-tert-butylphenol), 1,1,3-tris(2-methyl-4-hydroxy-5-tert-butylphenyl)butane, 1,3,5-trimethyl-2,4,6-tris(3,5-di-tert-butyl-4-hydroxybenzyl)benzene, and tetrakis-[methylene-3-(3',5'-di-tert-butyl-4'-hydroxyphenyl)propionate]methane, sulfur-containing antioxidants such as dilauryl-3,3'-thiodipropionate and distearyl-3,3'-thiodipropionate, and phosphorus-containing antioxidants such as triphenyl phosphate, diphenylisodecyl phiosphite, cyclic neopentanetetraylbis(octadecyiphosphite), and tris(2,4-di-tert-butylphenyl)phosphite. Further, an agent for preventing the aging of a rubber can be used. The above agent can be selected from poly(2,2,4-trimethyl-1,2-dihydroquinoline), 6-ethoxy-1,2-dihydro-2,2,4-trimethylquinoline, 1-(N-phenylamino)naphthalene, dialkyldiphenylamine, N,N'-diphenyl-p-phenylenediamine, N-phenyl-N'-isopropyl-p-phenylenediamine, N,N'-di-2-naphthyl-p-phenylenediamine, 2,5-di-tert-butylhydroquinone, 2-mercaptobenzimidazole, nickel dibutyldithiocarbamate, and tris(nonylphenyl)phosphite.

The amount ratio of the above components (a) to (e) is as follows. The amount of the phenolic resin and/or epoxy resin (b) per 100 parts by weight of the acrylonitrile-butadiene copolymer is 20 to 500 parts by weight, preferably 50 to 300 parts by weight. Per 100 parts by weight of the components (a) and (b) in total, the amount of the electrically conductive filler (c) is 1 to 100 parts by weight, preferably 5 to 70 parts by weight, the amount of the bromine-containing flame retardant is 1 to 50 parts by weight, preferably 5 to 40 parts by weight, and the amount of the antioxidant as the component (e) which is used as required is 1 to 10 parts by weight. When the amount of the component (b) is smaller than 20 parts by weight, the tackiness on an adhesive surface increases, and handling of a sheet is difficult. Further, the heat resistance of a cured product is low. When the amount of the component (b) is larger than 500 parts by weight, the flexibility and the adhesion strength are low. When the amount of the component (c) is smaller than 1 part by weight, no predetermined electric conductivity can be obtained. When the amount of the component (c) exceeds 100 parts by weight, the flexibility and the adhesion strength are low. Further, when the amount of the component (d) is smaller than 1 part by weight, no sufficient flame retardancy can be obtained. When the amount of the component (d) exceeds 50 parts by weight, the adhesion strength is low. Further, when the amount of the component (e) is smaller than 1 part by weight, the adhesive may be unstable against deterioration under heat. When the amount of the component (e) is larger than 10 parts by weight, the adhesive strength is low.

The acrylonitrile-butadiene copolymer may contain a crosslinking agent selected from quinones, dialkyl peroxides or peroxyketals, such that it can undergo self-crosslinking under heat.

In the electrically conductive adhesive composition of the present invention, the components (a) to (d) and optionally the component (e) are required to be present in a state where they are homogeneously dissolved or dispersed. For this purpose, an organic solvent may be used. The organic solvent is preferably selected from ketone solvents such as methyl ethyl ketone (MEK) and methyl isobutyl ketone (MIBK), ester solvents such as ethyl acetate and butyl acetate, and ether solvents such as tetrahydrofuran, in any of which the components (a) and (b) are soluble. Further, a diluent may be used. The diluent is selected from alcohol solvents such as methanol and propanol, aromatic hydrocarbon solvents such as toluene and xylene, and aliphatic hydrocarbon solvents such as ligroin and rubber volatile oil.

The electrically conductive adhesive composition or the electrically conductive adhesive sheet of the present invention, after cured under heat, has a volume resistivity of $2 \times 10^{-2}$ to $2 \times 10^{3}$ $\Omega \cdot cm$, preferably $2 \times 10^{-2}$ to $1 \times 10^{3}$ $\Omega \cdot cm$, more preferably $1 \times 10^{-1}$ to $2 \times 10^{2}$ $\Omega \cdot cm$. When the adhesive composition or the adhesive sheet has a volume resistivity in the above range, excellent shield properties against electromagnetic waves can be accomplished by attaching an electrically conductive fiber sheet or a metal foil to FPC through the adhesive. More specifically, electromagnetic waves caught in the electrically conductive fiber sheet or the metal foil are converted to eddy current, and the eddy current is leaked to a grounding provided in an FPC layer through the adhesive. When the volume resistivity of the electrically conductive adhesive composition exceeds the upper limit of the above range, it is difficult to effectively leak the eddy current generated by electromagnetic waves to the grounding in the FPC layer, and the electromagnetic wave shield effect is insufficient. When the above volume resistivity is smaller than the above lower limit, it is difficult to uniformly disperse the filler, and the strength of adhesion to FPC is low.

The electrically conductive adhesive composition of the present invention is produced by dissolving the above components (a) and (b) in the above organic solvent and then dispersing the electrically conductive filler (c) in the solution of the components (a) and (b). The bromine-containing flame retardant (d) and optionally the stabilizer (e) may be dissolved or dispersed. The dispersing is carried out in the solvent or the other components, and each component or a plurality of the components are dispersed with a proper device such as an attritor, a sand mill, a pearl mill, or the like. The above solution and dispersion are prepared by weighing each component such that the electrically conductive adhesive composition as an end product has the specified amount ratio.

The electrically conductive adhesive sheet of the present invention is obtained by applying the above electrically conductive adhesive composition onto a supporting substrate such as a release paper or a release film and drying the composition in the form of a sheet having a thickness of 5 to 500 $\mu$m. The above adhesive sheet is required to have a thickness in the above range for being applied to a metal fiber sheet or a metal foil which will be explained later. When the thickness is less than 5 $\mu$m, no necessary adhesion strength is obtained. When it exceeds 500 $\mu$m, the electric conductivity between the metal fiber sheet or the metal foil and FPC is deficient, so that the shielding effect against electromagnetic waves is low and further that the flexibility is low. The electrically conductive adhesive sheet is prepared by drying the electrically conductive adhesive composition under heat for volatilizing the organic solvent. However, since the electrically conductive adhesive sheet is required to be attached and bonded to the metal fiber sheet or the metal foil in a subsequent step, it is required to be maintained in a semi-cured state. A semi-cured sheet is prepared by controlling amounts and components of the above composition and heating conditions as required.

The electrically conductive adhesive sheet of the present invention includes three forms; (1) a form of a sheet formed of the electrically conductive adhesive composition alone, (2) a form of a sheet formed of the electrically conductive adhesive composition and the above release paper or release film onto which a sheet (layer) of said composition is formed, and (3) a form of a laminate formed of the sheet described in (2) and other release paper or release film which is laminated on the sheet surface of said composition.

The electromagnetic wave shield material is prepared by impregnating an electrically conductive fiber sheet having a surface resistivity of 1 $\Omega/\square$ or less with the above electrically conductive adhesive composition or applying the above electrically conductive adhesive composition to said electrically conductive fiber sheet. The present inventors have studied electromagnetic wave shield capability of various electrically conductive fibers in the form of a sheet, and as a result, it has been found that surface resistivity values found by measuring the electrically conductive fibers in the form of a sheet have a good correlation to shielding properties. That is, each of electrically conductive fiber sheets having a surface resistivity of 1 $\Omega/\square$ or less exhibits effective electromagnetic wave shield capability.

The present inventors have made further detailed studies, and it has been found that an electromagnetic wave shield material which has a surface resistivity of 1 $\Omega/\square$ or less after the above composition is pressed under heat, i.e., cured, can give a more desirable result. That is, it has been found that an electromagnetic wave shield material having a surface resistivity of 1 $\Omega/\square$ or less after the curing exhibits effective electromagnetic wave shield capability.

The electrically conductive fiber for forming the electrically conductive fiber sheet can be selected from a metal fiber, a carbon fiber or a metal-plated fiber. The metal fiber includes a stainless steel fiber, a titanium fiber, a nickel fiber, a brass fiber, a copper fiber, an aluminum fiber, fibers of various alloys and fibers of composites of these metals. The metal-plated fiber refers not only to a fiber prepared by plating a metal fiber or carbon fiber surface with a metal having a high electric conductivity such as Al, Au, Pt, Pd, Cu, Fe, Ni, a solder, stainless steel or ITO by an electroless plating method and/or an electric plating method, but also to a fiber prepared by plating an organic fiber, which is not necessarily required to have electric conductivity, with any one of the above high-electric-conductivity metals by the above method(s). The above electrically conductive fibers per se generally have a volume resistivity of $10^{-2}$ $\Omega \cdot cm$ or less, while the surface resistivity of sheets of these fibers differs to a great extent depending on kinds and porosities of the electrically conductive fibers and intertwinement states of individual fibers. However, the kind of the fiber is not critical so long as a sheet of the fiber has a surface resistivity of 1 Ω/□ or less.

The above electrically conductive fiber can be formed into a sheet according to a method of producing a woven fabric, a net (knitted product), a non-woven fabric or paper. In the present invention, the method of forming the above sheet is not critical so long as the formed sheet has the above-described electrical property. The thickness of the electrically conductive fiber sheet is 10 to 500 μm, preferably 20 to 300 μm. When the above thickness is less than 10 μm, not only the electromagnetic wave shield capability is deficient, but also the sheet has poor tensile strength, so that handling of the sheet is difficult. Further, when the above thickness exceeds 500 μm, undesirably, the flexibility is low.

The electromagnetic wave shield material of the present invention can be produced according to general impregnation, application or printing method, in which the electrically conductive adhesive composition is applied to, or printed on, the electrically conductive fiber sheet, or the electrically conductive fiber sheet is impregnated with the electrically conductive adhesive composition, and the electrically conductive adhesive composition is dried. When it is difficult to impregnate an electrically conductive fiber sheet having a high porosity and a low tensile strength with the electrically conductive adhesive composition while it has the form of a roll, there may be used a flexible supporting substrate such as a release paper, a release film or a metal foil. For example, in a state where the electrically conductive fiber sheet and a flexible supporting substrate are attached to each other, the electrically conductive adhesive composition is applied to, or printed on, the electrically conductive fiber sheet. Otherwise, the electrically conductive fiber sheet may be laminated on an electrically conductive adhesive composition layer (electrically conductive adhesive sheet) formed on the supporting substrate by an application or printing method. The so-prepared laminate is then subjected to a predetermined heating/drying step, whereby the electromagnetic wave shield material of the present invention can be obtained. The condition of the above heating is set at a level at which the electrically conductive adhesive composition is maintained at a semi-cured state, for attaching the electromagnetic wave shield material to FPC at a step to follow. The electromagnetic wave shield material of the present invention includes a constitution in which the release paper, the release film or the flexible supporting substrate such as a metal foil, which has been used for the production thereof, is laminated on one surface or each surface thereof.

In the present invention, a metal foil having the same material quality as that of the electrically conductive fiber sheet may be used. The thickness of the above metal foil is preferably 5 to 100 μm, more preferably 10 to 50 μm. When the above thickness is smaller than the above lower limit, handling of the metal foil is difficult. When the above thickness exceeds the above upper limit, the flexibility is low. Further, for improving the flexibility, there may be used a punched metal prepared by making a large number of fine through holes in the entire surface of a metal foil by an etching or pressing method, an expanded metal prepared by notching a metal foil and expanding it, or a pleated or embossed metal foil.

The electrically conductive adhesive sheet is laminated on the electrically conductive fiber sheet or the metal foil by a press-bonding these two members to each other under heat according to a general laminating method. When the release paper, the release film, or the like is laminated on each surface of the electrically conductive adhesive sheet, the release paper, the release film or the like on at least one surface is removed before the above two members are attached to each other. In this step, the adhesive component is also required to be maintained in a semi-cured state, for bonding the electrically conductive adhesive sheet to FPC in a step to follow.

The electromagnetic-wave-shield-functioning flexible printed wiring board of the present invention is fabricated by attaching the above electromagnetic wave shield material to one surface or each surface of FPC according to a general laminating method.

In FPC for use in the present invention, a polyimide film as a base substrate, a copper foil layer for forming a circuit and a cover film to be formed thereon can have various thickness values. Further, the FPC has a structure in which part of the circuit has the above grounding function, and an opening portion having a circular form having a diameter of approximately 1 mm to 10 mm or having any necessary form is formed on the substrate side or cover-lay film side of the grounding, so that the grounding is exposed. For reliable conduction between the electrically conductive adhesive composition and the grounding, and for improving the adhesion between the electrically conductive fiber sheet or the metal foil and FPC through the thermosetting electrically conductive adhesive composition, a heating and pressing process is carried out with a press machine as required.

When the electrically conductive fiber sheet is used, electrically conductive fibers may be dissociated or may fluff from the electrically conductive fiber sheet integrated with FPC. For preventing this failure, it is preferred to control the basis weight and porosity of the electrically conductive fiber sheet and the impregnation or application amount of the electrically conductive adhesive composition as required. Otherwise, an electrically conductive adhesive sheet may be attached to each surface of the electrically conductive fiber sheet to cover all the surface fiber. In another method, a flexible and proper resin may be coated on a surface of the electrically conductive fiber sheet integrated with FPC which surface may cause the above dissociation or fluffing of fibers, by a spray coating, screen printing or roll coating method.

EFFECT OF THE INVENTION

The electrically conductive adhesive composition and the electrically conductive adhesive sheet of the present invention have excellent adhesion capability and electric conductivity, and have excellent flame retardancy. The electromagnetic wave shield material to which the electrically conductive adhesive composition or the adhesive sheet is applied not only exhibits excellent shielding properties against electromagnetic waves in FPC but also is excellent in adhesion to FPC and flexibility. Further, it has a high flame retardancy of the V-1 to V-0 level.

Further, due to the use of the tetrabromobisphenol A derivative, the electromagnetic wave shield material not only exhibits excellent shield properties against electromagnetic waves in FPC but also is excellent in adhesion to FPC, durability against a high-temperature and high-humidity environment and flexibility, and it further has a high flame retardancy of the V-1 to V-0 level.

EXAMPLES

The present invention will be explained more specifically with reference to Examples hereinafter. In Examples, "part" stand for "part by weight".

Example 1

An electrically conductive adhesive composition containing the following components was prepared.

Acrylonitrile-butadiene copolymer (trade name: NIPOL1001, supplied by Nippon Zeon Co.,Ltd.) 100 parts Bisphenol A type resol type phenolic resin (trade name: Shonol CKM-908, supplied by Showa Highpolymer Co.,Ltd.) 100 parts Carbon Powder (trade name: Denka Black HS-100, supplied by Denki Kagakii Kogyo K.K., DBP oil absorption 140 ml/100 g) 60 parts High-molecular-weight hindered phenol-containing antioxidant (trade name: Adekastab AO-60, supplied by Asahi Denka Kogyo K.K.) 6 parts

| | |
|---|---|
| Bromine-containing flame retardant: Brominated aromatic compound (trade name: Pyroguard SR-600A, supplied by Dai-ichi Kogyo Seiyaku Co., Ltd) | 30 parts |
| MEK | 400 parts |
| MIBK | 300 parts |

The above electrically conductive adhesive composition was applied to a release PET film having a thickness of 38 μm, and the composition was dried in a hot-air-circulating dryer at 130° C. for 3 minutes, to obtain an electrically conductive adhesive sheet having an adhesive layer thickness of 30 μm. The sheet had a volume resistivity of 3.0 Ω·cm.

75 Parts of a stainless steel fiber having a fiber diameter of 8 μm and a fiber length of 5 mm and 25 parts of a binder fiber (trade name: Kuraray Vinylon VPB 105, supplied by Kuraray Co.,Ltd.) were formed into a slurry, a thin sheet was made from the slurry, i.e., a wet sheet having a large content of the metal fiber was obtained, and the sheet was sintered to give a stainless steel fiber sheet having a basis weight of 50 g/m$^2$, a porosity of 78% and a thickness of 35 μm.

The adhesive surface of the above electrically conductive adhesive sheet and the stainless steel fiber sheet were attached with a hot laminator at a laminating rate of 1 m/minute at a temperature of 120° C., to give an electromagnetic shield material of the present invention.

Then, the release PET film was removed from the electromagnetic shield material, and the exposed adhesive surface of the electromagnetic shield material was attached to the cover-lay film of FPC. The resultant set was hot-pressed at 170° C. at 30 kg/cm$^2$ for 15 minutes, to give an electromagnetic-wave-shield-functioning flexible printed wiring board. The FPC used above had a structure of polyimide film (25 μm)/adhesive layer (20 μm)/copper foil (25 μm)/cover-lay film (50 μm).

Examples 2–10

An electrically conductive adhesive sheet, an electromagnetic wave shield material and FPC to which these were applied were produced in the same manner as in Example 1 except that the bromine-containing flame retardant was replaced with a material shown in Table 1.

Examples 11–15

An electrically conductive adhesive sheet, an electromagnetic wave shield material and an electromagnetic-wave-shield-functioning flexible printed wiring board were produced in the same manner as in Example 1 except that the stainless steel fiber sheet was replaced with an electrically conductive fiber sheet shown in Table 2.

Comparative Example 1

An electrically conductive adhesive sheet, an electromagnetic wave shield material and an electromagnetic-wave-shield-functioning flexible printed wiring board were produced in the same manner as in Example 1 except the bromine-containing flame retardant was not used.

Comparative Example 2

An electrically conductive adhesive sheet, an electromagnetic wave shield material and an electromagnetic-wave-shield-functioning flexible printed wiring board were produced in the same manner as in Example 1 except the bromine-containing flame retardant was replaced with a material shown in Table 1.

Comparative Examples 3–4

An electrically conductive adhesive sheet was prepared in the same manner as in Example 1 except that the stainless steel fiber sheet was replaced with an electrically conductive fiber sheet shown in Table 2. Thereafter, a comparative electromagnetic shield material and an electromagnetic-wave-shield-functioning flexible printed wiring board were produced in the same manner as in Example 1.

Evaluations and Evaluation Methods

① Flame retardancy: An electromagnetic-wave-shield-functioning flexible printed wiring board was tested in a combustion test according to the 20 mm vertical combustion test of UL94.

② Adhesion strength: Since it was difficult to measure an electromagnetic-wave-shield-functioning flexible printed wiring board for an accurate adhesion strength, a sample was prepared by attaching a copper foil having a thickness of 105 μm and a polyimide film having a thickness of 25 μm through an electrically conductive adhesive sheet under the same hot pressing conditions as those in Example. The adhesive layer was measured for a 90° peel strength between the copper foil and the adhesive layer at 25° C. at a peeling rate of 50 mm/minute. The peel strength which the present invention aimed at was at least 1 kgf/cm or more.

③ Volume resistivity: An adhesive layer of an electrically conductive adhesive sheet was transferred to a polyimide film and cured by heating it at 170° C. for 15 minutes. The cured adhesive layer was measured with a low-resistivity metal Loresta MP supplied by Mitsubishi Chemical Corporation.

④ Surface resistivity: An electrically conductive fiber sheet was measured with a low-resistivity meter Loresta MP supplied by Mitsubishi Chemical Corporation.

⑤ Shielding properties against electromagnetic waves: An electromagnetic shield material was used as a sample. The sample was measured for an attenuation ratio of an electric field of 1 GHz according to an Advantest method. The attenuation ratio which the present invention aimed at, as shielding properties against electromagnetic waves, was at least 40 dB.

Table 1 shows results of evaluations of flame retardancy and adhesion strength in Examples 1 to 10 and Comparative Examples 1 and 2.

TABLE 1

Flame retardant, flame retardancy and adhesion strength

| | Flame retardant (trade name, supplier) | Melting point (° C.) | Bromine content (%) | Flame retardancy (UL94) | Peel strength (kgf/cm) |
|---|---|---|---|---|---|
| Ex. 1 | Brominated aromatic compound (Pyroguard SR-600A, Dai-ichi Kogyo Seiyaku Co., Ltd.) | 280 | 80 | V-0 | 1.6 |
| Ex. 2 | Decabromodiphenyl ether (Plasafety EB-10, Manac) | 306 | 83 | V-0 | 1.9 |
| Ex. 3 | Brominated epoxy-modified resin (Plasafety EBR-734, Manac) | 160 | 52 | V-1 | 1.6 |
| Ex. 4 | Tetrabromobisphenol A Fireguard 2000, Teijin Kasei) | 180 | 59 | V-0 | 2.1 |
| Ex. 5 | Carbonate oligomer of tetrabromobisphenol A (Fireguard 7500, Teijin Kasei) | 210 | 52 | V-1 | 1.8 |
| Ex. 6 | Tris(tribromoneopentyl) phosphate (CR-900, Daihachi Chemical Industry Co., Ltd.) | 181 | 70 | V-0 | 2.2 |
| Ex. 7 | Brominated aromatic compound (Pyroguard SR-720, Dai-ichi Kogyo Seiyaku Co., Ltd.) | 110 | 65 | V-0 | 0.5. |
| Ex. 8 | Brominated epoxy derivative (Plasafety EB-242, Manac) | 70 | 54 | V-1 | 0.4 |
| Ex. 9 | Brominated epoxy-modified resin (Plasafety EBR-700, Manac) | 120 | 51 | V-1 | 0.7 |
| Ex. 10 | Tetrabromobisphenol A derivative (Fireguard 3100, Teijin Kasei) | 100 | 67 | V-0 | 0.6 |
| CEx. 1 | Nil | — | — | X*1 | 2.2 |
| CEx. 2 | Aromatic fused phosphate ester (PX-200, Daihachi Chemical Industry Co., Ltd.) | 95 | (phosphorus: 9%) | V-2 | 0.5 |

Notes:
*1: No self-extinguishability
Ex. - Example,
Cex. - Comparative Example

The above results clearly show the effect of the bromine-containing flame retardants, and when the bromine content was more than 50%, the electromagnetic-wave-shield-functioning flexible printed wiring boards showed excellent flame retardancy of the V-1 level. Further, the melting point of the bromine-containing flame retardants had a large effect on the adhesion strength, and when the melting point was 150° C. or higher, an adhesion strength of 1 kgf/cm was obtained.

Further, Table 2 shows results of evaluations of surface resistivity and shielding properties against electromagnetics in Example 1, Examples 11 to 15 and Comparative Examples 3 and 4.

TABLE 2

Electrically conductive fiber sheet and shielding properties against electromagnetic waves

| | Electrically conductive fiber sheet (supplier) | Sheet thickness (μm) | Surface resistivity (Ω/□) | Shielding properties against electromagnetic waves (dB) |
|---|---|---|---|---|
| Ex. 1 | Stainless steel fiber sheet: fiber diameter 8 μm | 35 | 0.24 | 57 |

TABLE 2-continued

Electrically conductive fiber sheet and shielding properties against electromagnetic waves

| | Electrically conductive fiber sheet (supplier) | Sheet thickness (μm) | Surface resistivity (Ω/□) | Shielding properties against electromagnetic waves (dB) |
|---|---|---|---|---|
| Ex. 11 | Nylon 66 melt blow mesh sheet plated with Ni and Cu: diameter of plated fiber 25 μm (Monsanto Textile Co.) | 74 | 0.05 | 65 |
| Ex. 12 | Mesh textile made of polyester and plated with Ni and Cu: diameter of plated fiber 30 μm (Densymesh MT3-250, Nisshinbo Industries Inc.) | 51 | 0.30 | 63 |
| Ex. 13 | Plain woven cloth made of polyester and plated with Ni and Cu: diameter of plated fiber 30 μm (Densycloth MT3-A, Nisshinbo Industries Inc.) | 190 | 0.10 | 53 |
| Ex. 14 | Long-fiber-like carbon fiber textile plated with Ni and | 150 | 0.20 | 63 |

TABLE 2-continued

Electrically conductive fiber sheet and shielding properties against electromagnetic waves

| | Electrically conductive fiber sheet (supplier) | Sheet thickness (μm) | Surface resistivity (Ω/□) | Shielding properties against electromagnetic waves (dB) |
|---|---|---|---|---|
| Ex. 15 | Cu: diameter of plated fiber 15 μm (Toho Rayon K.K.) PBO fiber mesh textile plated with Ni and Cu: diameter of plated fiber 20 μm (Zylon HM, multifilament 250 d, Toyobo Co., Ltd.) | 100 | 0.50 | 60 |
| CEx. 3 | Long-fiber-like carbon fiber textile: fiber diameter 10 μm (Toho Rayon K.K.) | 190 | 40 | 15 |
| CEx. 4 | Short-fiber-like carbon fiber non-woven fabric plated with Cu: diameter of plated fiber 10 μm (Melbrone, Petka) | 200 | 20 | 30 |

Ex. = Example,
CEx. = Comparative Example

Table 2 shows that when the electrically conductive fiber sheet having a surface resistivity of 1 Ω/□ or less is used, excellent shielding properties against electromagnetic waves in terms of at least 50 dB can be obtained. The electrically conductive adhesive sheets prepared in the above Examples and Comparative Examples had a volume resistivity of 15 to 25 Ω·cm. Further, all the samples prepared in Examples had excellent flexibility.

Example 16

An electrically conductive adhesive composition containing the following components was prepared.
Acrylonirile-butadiene copolymer (trade name: NIPOL1001, supplied by Nippon Zeon Co., Ltd.) 75 parts
Bisphenol A type epoxy resin (trade name: Epikote 1004, supplied by Yuka-Shell Epoxy K.K.) 100 parts
Curing agent: 1-cyanoethyl-2-ethyl-4-methylimidazole (trade name: Curezole 2E4MZ-CN, supplied by Shikoku Kasei Kogyo) 5 parts
Carbon Powder (trade name: Denka Black HS-100, supplied by Denki Kagaku Kogyo K.K.) 50 parts
Antioxidant: tetrakis-[methylene-3-(3',5'-di-tert-butyl-4'-hydroxyphenylpropionate)methane (trade name: Adekastab AO-60, supplied by Asahi Denka Kogyo K.K.) 5 parts

| | |
|---|---|
| Bromine-containing flame retardant: hexabromobenzene (Plasafety HBB, melting point 320° C., bromine content 84%, supplied by Manac) | 30 parts |
| MEK | 500 parts |
| MIBK | 300 parts |

An electrically conductive fiber sheet which was the same as the electrically conductive fiber sheet used in Example 11 was placed on a release PET film having a thickness of 38 μm, and the above electrically conductive adhesive composition was applied thereto and dried in a hot-air-circulating dryer at 130° C. for 5 minutes, to obtain an electromagnetic wave shield material in which the electrically conductive fiber sheet was impregnated with the electrically conductive adhesive composition. The electromagnetic wave shield material showed an attenuation ratio of 62 dB as shielding properties against electromagnetic waves. Further, the electromagnetic wave shield material was attached to FPC in the same manner as in Example 1, to obtain an electromagnetic-wave-shield-functioning flexible printed wiring board. The wiring board showed a flame retardancy of V-0. Separately, the above electrically conductive adhesion composition was applied to the same release PET film as above and dried, to give an electrically conductive adhesive sheet. The electrically conductive adhesive sheet had a volume resistivity of 22 Ω·cm and showed adhesion strength of 1.7 kgf/cm in terms of a peel strength.

Example 17

An electrically conductive adhesive composition containing the following components was prepared. "%" stands for "% by weight" and corresponds to solid contents of an adhesive.
Acrylonirile-butadiene copolymer (trade name: NIPOL1001, supplied by Nippon Zeon Co., Ltd.) 30%
Bisphenol A type resol type phenolic resin (trade name: Shonol CKM-908, supplied by Showa Highpolymer Co., Ltd.) 16%
Carbon Powder (trade name: Denka Black HS-100, supplied by Denki Kagaku Kogyo K.K.) 20%
Antioxidant: (trade name: Adekastab AO-60, supplied by Asahi Denka Kogyo K.K.) 2%
Dispersing agent (carboxylic acid-containing surfactant, trade name: Homogenol L-18, supplied by Kao Corporation) 2%
Tetrabromobisphenol A derivative (trade name: Fireguard 3000, supplied by Teijin Kasei) 30%

As an organic solvent, a methyl ethyl ketone/methyl isobutyl ketone mixture having a methyl ethyl ketone/methyl isobutyl ketone weight ratio of 6/4 was used in such an amount that the solid content of the above composition was 30%.

The above electrically conductive adhesive composition was applied onto a release PET film having a thickness of 38 μm, and the composition was dried in a hot-air-circulating dryer at 130° C. for 3 minutes, to obtain an electrically conductive adhesive sheet having an adhesive layer thickness of 30 μm.

A slurry containing 90% of a stainless steel fiber having a fiber diameter of 8 μm and a fiber length of 5 mm and 10% of a binder PVA fiber (trade name: Kuraray Vinylon Fibrid VPB, supplied by Kuraray Co., Ltd.) was prepared, a thin sheet was made from the slurry, i.e., a wet sheet having a large content of the metal fiber was obtained, and the sheet was sintered to give an electrically conductive fiber sheet formed of the stainless steel fiber, the electrically conductive fiber sheet having a basis weight of 50 g/m$^2$, a porosity of 78% and a thickness of 35 μm.

The adhesive surface of the above electrically conductive adhesive sheet and the stainless steel fiber sheet were attached with a hot laminator at a laminating rate of 1 m/minute at a temperature of 80° C., to give an electromagnetic shield material of the present invention.

Further, a polyimide film having a thickness of 25 μm, the adhesive layer of the above electrically conductive adhesive sheet and a copper foil having a thickness of 108 μm were laminated in the above-described order, and the laminate was hot-pressed at 170° C. at 30 kg/cm$^2$ for 15 minutes to cure the electrically conductive adhesive composition, whereby a sample for measuring an adhesion strength was obtained. That is, the sample had a structure of the polyimide film (25 μm)/the adhesive layer (30 μm)/the copper foil (108 μm).

Examples 18–22

An electromagnetic wave shield material and samples for measuring an adhesion strength were prepared in the same manner as in Example 17 except that the electrically conductive fiber sheet used in Example 17 was replaced with an electrically conductive fiber sheet shown in Table 4.

Comparative Example 5

A comparative electromagnetic wave shield material and samples for measuring an adhesion strength were prepared in the same manner as in Example 17 except that the tetrabromobisphenol A derivative was not used.

Comparative Example 6

A comparative electromagnetic wave shield material and samples for measuring an adhesion strength were prepared in the same manner as in Example 17 except that the tetrabromobisphenol A derivative was replaced with a phosphate ester-containing flame retardant.

Comparative Examples 7–8

A comparative electromagnetic wave shield material was prepared in the same manner as in Example 17 except that the electrically conductive fiber sheet was replaced with an electrically conductive fiber sheet shown in Table 4.

Evaluations and Evaluation Methods (1) Flame retardancy: The electromagnetic wave shield materials prepared in Example 17 and Comparative Examples 5 to 6 were in a combustion test according to the 20 mm vertical combustion test of UL94. In Table 3, A shows that the level of VTM-0 was satisfied, and X shows that the above level was not satisfied.

(2) Adhesion strength:

<No. 1> Ordinary-temperature ordinary-humidity test 25° C., 65%RH)(OTOH): The sample for measuring an adhesion strength, prepared in Example 17 and Comparative Examples 5 to 6 were measured for a 90° peel strength. The peel strength which the present invention aimed at was at least 0.5 kgf/cm.

<No. 2> High-temperature test (HT): The samples for measuring an adhesion strength, prepared in Example 17 and Comparative Examples 5 to 6, which were subjected to a reflow test, were allowed to stand in an atmosphere having a temperature of 85° C. for 200 hours, and then measured for a 90° peel strength. The peel strength which the present invention aimed at was at least 0.5 kgf/cm.

<No. 3> High-temperature high-humidity test (HHT): The samples for measuring an adhesion strength, prepared in Example 17 and Comparative Examples 5 to 6, which were subjected to a reflow test, were allowed to stand in an atmosphere having a temperature of 85° C. and a humidity of 85%RH for 200 hours, and then measured for a 90° peel strength. The peel strength which the present invention aimed at was at least 0.5 kgf/cm.

(3) Reflow test: The samples for measuring an adhesion strength, prepared in Example 17 and Comparative Examples 5 to 6, were allowed to pass through an atmosphere having a temperature of 260° C. for 30 seconds, and evaluated for a presence or an absence of a swelling and a foaming.

(4) Volume resistivity: An adhesive layer of an electrically conductive adhesive sheet was measured according to JIS K7194 with a Loresta MP supplied by Mitsubishi Chemical Corporation.

(5) Surface resistivity of cured surface: An electrically conductive fiber sheet and a textile were hot pressed at 170° C. at 30 kg/cm$^2$ for 15 minutes, and each was according to JIS K7194 with a Loresta MP supplied by Mitsubishi Chemical Corporation.

(6) Shielding properties against electromagnetic waves: An electromagnetic shield material was cured by carrying out hot-pressing at 170° C. at 30 kg/cm$^2$ for 15 minutes, to obtain a cured sample. The cured sample was measured by an attenuation ratio of an electric field of 1 Ghz according to an Advantest method. The attenuation ratio which the present invention aimed at, as shielding properties against electromagnetic waves, was at least 40 db.

Table 3 shows results of flame retardancy, adhesion strength and reflow tests in Example 17 and Comparative Examples 5 to 6.

TABLE 3

| Flame retardant (supplier) | Flame retardancy (UL94) | Adhesion strength OTOH | HT | HHT | Reflow test |
|---|---|---|---|---|---|
| Ex. 17 FG3000 (Teijin Kasei) | A | 1.6 | 0.8 | 0.8 | No |
| CEx. 5 No | X | 1.6 | 1.0 | 0.8 | No |
| CEx. 6 SR540 (Daiichi Kogyo Seiyaku) | X | 0.7 | 0.8 | 0.8 | No |

Ex. = Example,
CEx. = Comparative Example

As is clearly shown in Table 3, the electromagnetic wave shield material using the tetrabromobisphenol A derivative, prepared in Example 17, satisfies both the flame retardancy and the adhesion strength. In contrast, the electromagnetic wave shield materials prepared in Comparative Examples 5 and 6 are poor in flame retardancy.

Further, Table 4 shows thickness of the electromagnetic wave shield materials prepared in Examples 17 to 22 and Comparative Examples 7 and 8 and also shows surface resistivity and shielding properties against electromagnetic waves in Examples 17 to 22 and Comparative Examples 7 and 8.

TABLE 4

| | Electrically conductive fiber sheet (supplier) | Thickness (μm) | Surface resistivity (Ω/□) | Shielding properties against electromagnetic waves (dB) | Volume (Ω · cm) Volume resistivity |
|---|---|---|---|---|---|
| Ex. 17 | Stainless steel fiber sheet: fiber diameter 8 μm | 35 | 0.24 | 57 | 0.24 |

TABLE 4-continued

| | Electrically conductive fiber sheet (supplier) | Thickness (μm) | Surface resistivity (Ω/□) | Shielding properties against electromagnetic waves (dB) | Volume (Ω · cm) Volume resistivity |
|---|---|---|---|---|---|
| Ex. 18 | Nylon 66 melt blow mesh sheet plated with Ni and Cu: diameter of plated fiber 25 μm (Monsanto Textile Co.) | 74 | 0.05 | 65 | 0.05 |
| Ex. 19 | Mesh textile made of polyester and plated with Ni and Cu: diameter of plated fiber 30 μm (Densymesh MT3-250, Nisshinbo Industries Inc.) | 51 | 0.30 | 63 | 0.31 |
| Ex. 20 | Plain woven cloth made of polyester and plated with Ni and Cu: diameter of plated fiber 30 μm (Densycloth MT3-A, Nisshinbo Industries Inc.) | 190 | 0.10 | 53 | 0.10 |
| Ex. 21 | Long-fiber-like carbon fiber textile plated with Ni and Cu: diameter of plated fiber 15 μm (Toho Rayon K.K.) | 150 | 0.20 | 63 | 0.21 |
| Ex. 22 | Polybenzbisoxazole fiber mesh textile plated with Ni and Cu: diameter of plated fiber 20 μm (Zylon HM, multifilament 250 d, Toyobo Co., Ltd.) | 100 | 0.50 | 60 | 0.52 |
| CEx. 7 | Long-fiber-like carbon fiber textile: fiber diameter 10 μm (Toho Rayon K.K.) | 190 | 70 | 10 | 30 |
| CEx. 8 | Short-fiber-like carbon fiber non-woven fabric plated with Cu: diameter of plated fiber 10 μm (Melbrone, Petka) | 200 | 10 | 40 | 3.5 |

Ex. = Example,
CEx. = Comparative Example

What is claimed is:

1. An electrically conductive adhesive composition comprising 100 parts by weight of (a) an acrylonitrile-butadiene copolymer having a nitrile content of 10 to 45%, 20 to 500 parts by weight of (b) at least one resin selected from the group consisting of a phenolic resin and an epoxy resin, 1 to 100 parts by weight, per 100 parts by weight of the components (a) and (b) in total, of (c) an electrically conductive filler and 1 to 50 parts by weight, per 100 parts by weight of the components (a) and (b) in total, of (d) a bromine-containing flame retardant.

2. An electrically conductive adhesive composition according to claim 1, wherein the bromine-containing flame retardant contains at least 50% by weight of brome.

3. An electrically conductive adhesive composition according to claim 1, wherein the bromine-containing flame retardant is a tetrabromobisphenol A derivative.

4. An electrically conductive adhesive composition according to claim 3, wherein the tetrabromobisphenol A derivative has the following formula,

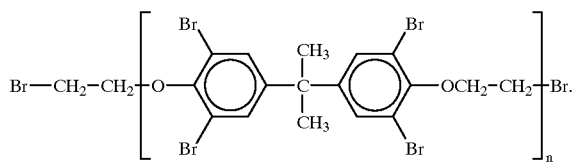

5. An electrically conductive adhesive composition according to claim 3, wherein the tetrabromobisphenol A derivative has the following formula,

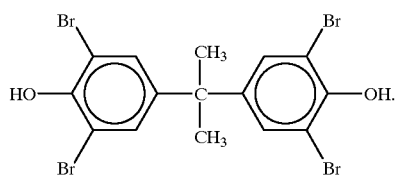

6. An electrically conductive adhesive composition according to claim 1, which further contains 1 to 10 parts by weight, per 100 parts by weight of the components (a) and (b) in total, of (e) a stabilizer.

7. An electrically conductive adhesive composition according to claim 1, wherein the phenolic resin is a resol type phenolic resin.

8. An electrically conductive adhesive composition according to claim 7, wherein the resol type phenolic resin is at least one resin selected from a bisphenol A type phenolic resin, an alkylphenol type phenolic resin or a co-condensation phenolic resin of these.

9. An electrically conductive adhesive composition according to claim 1, wherein the electrically conductive filler is a carbon powder.

10. An electrically conductive adhesive composition according to claim 9, wherein the carbon powder has a DBP (dibutyl phthalate) oil absorption, measured according to JIS K6221, of 20 to 200 ml/100 g.

11. An electrically conductive adhesive sheet formed of the electrically conductive adhesive composition recited in claim 1 in the form of a sheet.

12. An electrically conductive adhesive sheet according to claim 11, which has a volume resistivity of $2\times10^{-2}$ to $2\times10^{3}$ $\Omega\cdot$cm.

13. An electromagnetic wave shield material formed of the electrically conductive adhesive composition recited in claim 1 and an electrically conductive fiber sheet having a surface resistivity of 1 $\Omega/\square$ or less, wherein the electrically conductive fiber sheet is impregnated with the electrically conductive adhesive composition or the electrically conductive adhesive composition is applied to the electrically conductive fiber sheet.

14. An electromagnetic wave shield material according to claim 13, which has a surface resistivity of 1 $\Omega/\square$ or less after the electrically conductive adhesive composition is cured.

15. An electromagnetic wave shield material formed of a laminate of the electrically conductive adhesive sheet recited in claim 11 and an electrically conductive fiber sheet or a metal foil having a surface resistivity of 1 $\Omega/\square$ or less, wherein the electrically conductive adhesive sheet is laminated on one surface, or each surface, of the electrically conductive fiber sheet or metal foil and the electromagnetic shield material is a product formed by shaping under pressure.

16. An electromagnetic wave shield material according to claim 15, which has a surface resistivity of 1 $\Omega/\square$ or less after the electrically conductive adhesive sheet is cured.

17. An electromagnetic-wave-shield-functioning flexible printed wiring board formed of the electromagnetic wave shield material recited in claim 13 and a flexible printed wiring board, wherein the electromagnetic wave shield material is laminated on one surface, or each surface, of the flexible printed wiring board.

18. An electromagnetic-wave-shield-functioning flexible printed wiring board formed of the electromagnetic wave shield material recited in claim 15 and a flexible printed wiring board, wherein the electromagnetic wave shield material is laminated on one surface, or each surface, of the flexible printed wiring board.

* * * * *